United States Patent
Charles et al.

(10) Patent No.: US 9,456,513 B2
(45) Date of Patent: Sep. 27, 2016

(54) ARTICLE WITH GASKET HAVING MOISTURE TRANSMISSION RESISTIVITY AND METHOD

(75) Inventors: Scott B. Charles, Spring Valley, WI (US); Michael A. Kropp, Cottage Grove, MN (US); Ashu N. Mujumdar, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1336 days.

(21) Appl. No.: 12/705,008

(22) Filed: Feb. 12, 2010

(65) Prior Publication Data

US 2010/0214732 A1  Aug. 26, 2010

Related U.S. Application Data

(60) Provisional application No. 61/155,300, filed on Feb. 25, 2009.

(51) Int. Cl.
*H05K 5/06* (2006.01)

(52) U.S. Cl.
CPC .............. *H05K 5/061* (2013.01); *H05K 5/062* (2013.01)

(58) Field of Classification Search
CPC ............................ H05K 5/0056; H05K 5/061
USPC ........... 361/679.01, 679.02; 174/17, 50, 520, 174/521; 428/423.1; 264/127, 330, 331.14, 264/331.15, 331.18, 331.21, 496; 524/505, 524/528
See application file for complete search history.

(56) References Cited

U.S. PATENT DOCUMENTS

| | | | |
|---|---|---|---|
| 4,786,675 A | 11/1988 | Iwata et al. | |
| 4,852,979 A * | 8/1989 | Agrawal | 359/274 |
| 4,866,108 A | 9/1989 | Vachon et al. | |
| 5,008,135 A | 4/1991 | Giordano et al. | |
| 5,066,112 A * | 11/1991 | Lynam et al. | 359/267 |
| 5,216,536 A * | 6/1993 | Agrawal et al. | 359/274 |
| 5,672,400 A | 9/1997 | Hansen et al. | |
| 5,840,825 A | 11/1998 | Carlblom et al. | |
| 5,929,141 A | 7/1999 | Lau et al. | |
| 5,965,673 A | 10/1999 | Hermansen et al. | |
| 6,060,539 A | 5/2000 | Hermansen et al. | |
| 6,143,818 A * | 11/2000 | Wang et al. | 524/528 |
| 6,194,789 B1 | 2/2001 | Zhou | |
| 6,346,330 B1 | 2/2002 | Huang et al. | |
| 6,528,169 B2 | 3/2003 | Charles et al. | |
| 6,620,886 B2 | 9/2003 | Obrecht et al. | |
| 6,653,385 B2 * | 11/2003 | Wang et al. | 524/425 |

(Continued)

FOREIGN PATENT DOCUMENTS

| | | |
|---|---|---|
| CN | 2845407 | 12/2006 |
| EP | 0 892 027 A1 | 1/1999 |

(Continued)

OTHER PUBLICATIONS

PCT International Search Report, PCT/US2010/024019.

(Continued)

*Primary Examiner* — Adrian S Wilson

(57) ABSTRACT

This disclosure relates to gasket materials used for attaching and sealing covers to enclosures. More particularly, this disclosure relates to form-in-place gaskets, applied to surfaces of containers for sensitive electronic components. The gaskets include a flexible polymer and a micropowder polyolefin filler.

23 Claims, 3 Drawing Sheets

(56) References Cited

U.S. PATENT DOCUMENTS

| | | |
|---|---|---|
| 6,664,318 B1 | 12/2003 | Bymark et al. |
| 6,670,017 B2 | 12/2003 | Huang et al. |
| 6,723,803 B1 | 4/2004 | Hermansen et al. |
| 6,822,161 B2 * | 11/2004 | Komatsu et al. ............. 174/367 |
| 6,913,798 B2 | 7/2005 | Kitamura et al. |
| 6,921,297 B2 | 7/2005 | Quadir et al. |
| 6,967,833 B2 * | 11/2005 | Boykin et al. ............ 361/679.33 |
| 7,067,585 B2 * | 6/2006 | Wang et al. ................... 525/191 |
| 7,616,449 B2 * | 11/2009 | Batcheller et al. ........... 361/752 |
| 7,652,892 B2 * | 1/2010 | Shiu et al. .................... 361/752 |
| 7,666,947 B2 | 2/2010 | Hammar |
| 7,736,158 B2 * | 6/2010 | Yamaguchi .................. 439/76.2 |
| 7,943,868 B2 * | 5/2011 | Anders et al. ................ 174/564 |
| 7,957,152 B2 * | 6/2011 | Batcheller et al. ........... 361/752 |
| 2001/0023280 A1 * | 9/2001 | Duvalsaint et al. ............. 526/79 |
| 2004/0188120 A1 * | 9/2004 | Komatsu et al. ........ 174/17 CT |
| 2006/0290070 A1 * | 12/2006 | Park ............... 277/559 |
| 2007/0042193 A1 * | 2/2007 | Wang ......................... 428/423.1 |
| 2007/0061598 A1 * | 3/2007 | Bitton et al. .................. 713/194 |
| 2007/0104943 A1 | 5/2007 | D'Souza |
| 2007/0206365 A1 * | 9/2007 | Shiu et al. .................... 361/752 |
| 2007/0255012 A1 * | 11/2007 | Smith et al. .................. 525/416 |
| 2008/0183133 A1 | 7/2008 | Kiersh |
| 2010/0018778 A1 | 1/2010 | Nanayakkara |

FOREIGN PATENT DOCUMENTS

| | | |
|---|---|---|
| GB | 1136350 | 12/1968 |
| JP | 59149038 | 8/1984 |
| JP | 62041218 | 2/1987 |
| JP | 62100523 | 5/1987 |
| JP | 63017921 | 1/1988 |
| WO | WO 01/42230 A1 | 6/2001 |
| WO | WO 03/021138 A1 | 3/2003 |
| WO | WO 2005/020228 A1 | 3/2005 |
| WO | WO 2007/022308 A1 | 2/2007 |

OTHER PUBLICATIONS

Journal: Ralph D. Hermansen, et al., Advances in Custom-Formulated Flexible Epdxies, Adhesives Age, vol. 36, No. 8, pp. 38-41, (1993).

Standard: ASTM D395B, Standard Test Methods for Rubber Property-Compression Set[1], pp. 6, (2008).

Standard: ASTM F1249, Standard Test Method for Water Vapor Transmission Rate Through Plastic Film and Sheeting Suing a Modulated Infrared Sensor[1], pp. 5, (2006).

Cong-Sheng, Guan, et al., "Polyphenylene-Sulfide Paint and Applications Thereof," Beijing, Chemical Industry Press, Apr. 2007.

* cited by examiner

ARTICLE WITH GASKET HAVING MOISTURE TRANSMISSION RESISTIVITY AND METHOD

CROSS REFERENCE TO RELATED APPLICATION

This application claims the benefit of U.S. Provisional Patent Application No. 61/155,300, filed Feb. 25, 2009, the disclosure of which is incorporated by reference herein in its entirety.

FIELD

This disclosure relates to gasket materials used for attaching and sealing covers to enclosures. More particularly, this disclosure relates to form-in-place gaskets, applied to surfaces of containers for sensitive electronic components.

BACKGROUND

Electronic components can have operational properties that can be detrimentally affected by environmental conditions. Such conditions include electromagnetic interference (EMI), vibrations, and particulate and chemical contamination. Consequently, these devices can typically be protected by sealing them in a container that has a cover.

Conventional methods for gasket manufacture include either die-cutting a gasket out of an elastomeric sheet material, or shaping the gasket by injection-molding of an elastomeric mix. Both these methods require expensive tools such as punches and molds which add cost to the final product. Newer manufacturing methods deposit a bead or thread of a fluid elastomer from a nozzle onto a substantially planar surface. The pattern adopted by the fluid elastomer thread can be controlled using automated equipment, programmed so as to provide a gasket having a desired shape. After forming a desired gasket pattern, the fluid elastomer thread can be cured, using heat or light, either at ambient temperatures or in an oven, with or without accelerators or other additives.

Fluid elastomer compositions, suitable for "form-in-place" gaskets using automated applicators, include one or two part silicones, urethane acrylates, and epoxies. These compositions need to have suitable viscosities for automated dispensing from a nozzle, yet be curable to yield a gasket that can have properties such as vibration-damping, electronic shielding, and preventing contamination from outside sources. Additionally the gaskets need to be flexible and resilient.

SUMMARY

Hard disk drives are used in common consumer electronic devices such as personal and laptop computers and personal audio-video systems. The trend has become for the disk drives in these devices to become physically smaller and to be able to store more and more data. Accordingly, for fast access, disk drives rotate at extremely high speeds. Dispensable elastomer compositions can provide form-in-place gaskets designed for containers such as enclosures for hard disk drives. For accuracy of dimensions, placement and final positioning, various patterns of form-in-place gaskets typically require the dispensing of elastomer compositions using automated liquid dispensing followed by in-place curing to soft, resilient gaskets, exhibiting moisture-resistance, minimal compression set, and adhesion to selected substrates.

The elastomer compositions, before curing, should have sufficiently low viscosity to be readily dispensed. Curable compositions may be prepared as one-part formulations that include a catalyst or as two-part formulations requiring addition of a curative and/or catalyst before curing. Regardless of the components included in an uncured gasket composition, the curing process may be initiated thermally, photonically, a combination of both, and/or, in the container of two part formulations, by simply combining the parts under ambient conditions. Typically, uncured formulations provide non-slumping, dispensed beads of gasket material having good dimensional stability, as applied, with essentially no change in shape or position during and after curing.

For electronics grade cleanliness, properties of these elastomer compositions, after curing, include low outgassing and low extractable species. These properties surpass those of commercially available, silicone-based form-in-place gaskets which typically contain low molecular weight siloxanes that can damage electronic components following contamination of device surfaces. Since the provided articles utilize a flexible epoxy or acrylate based material, possible damage due to siloxane contamination is avoided.

It is important for the sealants to have properties such as flexibility and to have a low glass transition temperature, typically below 10° C. They also need to be easy to apply, insensitive to moisture during curing, and be capable of curing at relatively low temperatures. There is a need for better sealants for electronic devices that have these properties, are easy to apply, and are resistant to moisture transmission. There is a need for sealants that can form gaskets that can be useful for sealing containers in which electronic devices are enclosed.

In one aspect, an article for housing an electronic device is provided that includes a container having at least a first section and a second section, the first section having a first mating surface and the second section having a second mating surface; and a gasket in contact with the first mating surface and the second mating surface, wherein the gasket comprises a flexible polymer; and a filler, wherein the filler includes at least one hydrophobic semicrystalline polymer. The at least one hydrophobic semicrystalline polymer can include a polyolefin, a fluoropolymer, or a combination thereof. Additionally the hydrophobic semicrystalline polymer can have microcrystalline domains and can be in the form of a micropowder.

In another aspect, a method of sealing an electronic device is provided that includes providing a container having at least a first section and a second section, the first section having a first mating surface and the second section having a second mating surface, locating the electronic device in the first section of the first container, applying a bead of gasket precursor material to the first mating surface of the first section of the container, curing the bead of gasket precursor material to form a cured gasket, and placing the second section of the container such that the second mating surface of the second container comes into contact with the cured gasket and such that the first section of the container and the second section of the container at least partially surround the electronic device. The gasket includes a flexible polymer; and a filler, wherein the filler includes at least one hydrophobic semicrystalline polymer. The at least one hydrophobic semicrystalline polymer can include a polyolefin, a fluoropolymer, or a combination thereof. Additionally the hydrophobic semicrystalline polymer can have microcrystalline domains and can be in the form of a micropowder.

The gaskets in the provided articles and methods are formed from fluid prepolymer components that, upon curing are able to form a rubbery seal and are useful for sealing containers that contain electronic devices. The polymer systems include fillers that can form gasket materials, that when cured resist moisture transmission.

In this disclosure the terms:

"dispensable" refers to compositions that can be conveniently extruded from tubes, such as needles, attached to pressure reservoirs, to provide small diameter, typically about 1 mm, beads of sealant following the contours of a desired gasket pattern;

"electronics-grade cleanliness" refers to cured elastomeric compositions for form-in-place gaskets that satisfy electronics industry requirements such as low levels of outgassing and extractable ionic contaminants;

"fluid" refers a material that has flow properties, such as uncured gasket material, such that a desired amount of material can pass through an opening of fixed diameter under a fixed pressure during a fixed interval of time;

"gasket" and "seal" and "sealant" are used interchangeably;

"hydrophobic" refers to the low water absorption characteristic of elastomer compositions, which can provide gaskets having moisture barrier (moisture resistance) properties;

"(meth)acrylate" refers to both "methacrylate" and "acrylate"; and

"non-slumping" refers to the properties of an elastomer composition, including yield stress and viscosity that deter sagging or slumping during dispensing and curing.

The provided article including the provided compositions can provide gaskets for sealing electronic devices, such as hard disk drives, in containers in a manner so as to protect them from environmental factors such as contamination, electrical fields, vibration, and moisture. The provided methods of making gaskets can lead to low cost, high production, disk drive manufacture.

The above summary is not intended to describe each disclosed embodiment of every implementation of the present invention. The brief description of the drawing and the detailed description which follows more particularly exemplify illustrative embodiments.

DETAILED DESCRIPTION

Figure 1:
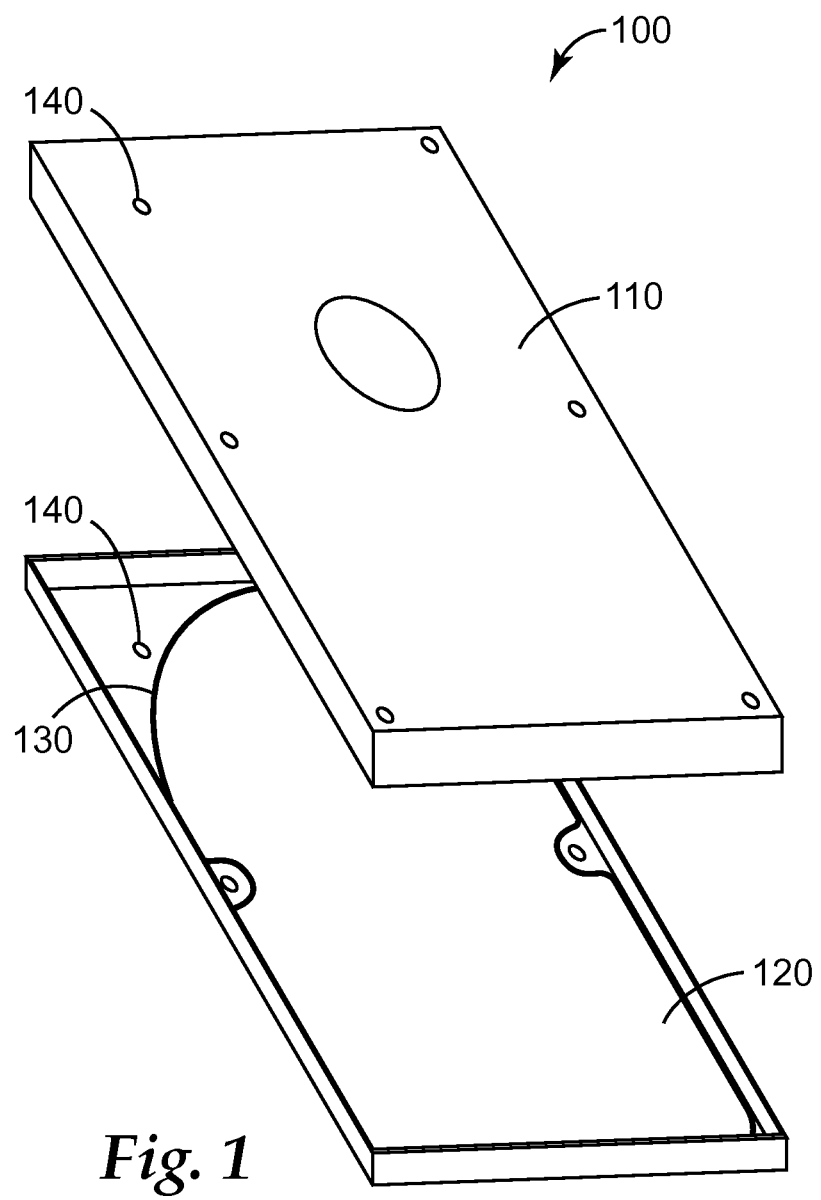
FIG. 1 is a perspective exploded view of a provided housing for an electronic device.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Dispensable elastomeric formulations, according to the provided article and method, provide form-in-place gaskets designed for containers such as enclosures for hard disk drives. Suitable elastomeric formulations may be applied to such containers using automated liquid dispensing followed by in-place curing to form soft, resilient gaskets, exhibiting moisture resistance, minimal compression set, and adhesion to selected substrates. The primary use for resilient gaskets, after curing, is to provide sealed interfaces between surfaces of protective containers. An effective seal prevents access of contaminants and moisture to protected structures.

Form-in-place gasket formulations are provided that overcome the disadvantages associated with previously available materials. The provided cured flexible gaskets are formed from dispensable formulations comprising oligomers, dimers, monomers, and crosslinking moieties.

When used for sealing containers of electronic components, the cured, form-in-place gasket becomes compressed under the mechanical force applied to close the container. Design criteria control the allowable closure force and gasket hardness for secure seating of one section of the container relative to another. Cured gasket materials have Shore A durometer values from about 25 to about 70, typically from about 40 to about 60 to enable full closure with a reasonable amount of force. To accommodate the possible use of electronic assemblies in differing climatic regions, cured gaskets, according to the present invention, maintain their elastomeric properties over a temperature range extending from about −40° C. to about 100° C. The possibility of re-entry into the container, for re-work, requires that the cured gasket has a low permanent compression set. Suitable form-in-place gasket formulations exist in a range, of permanent compression set, from about 7% to about 30% of the original deflection, measured by ASTM D395B, "Compression Set Under Constant Deflection". Low values of permanent compression set assure the resiliency of the gasket material for maintaining an adequate seal during the lifetime of the container and facilitating gasket reuse if the container is reopened for rework of protected electronic assemblies.

While mechanical force increases the contact between a cured gasket and surfaces of the container, the physical properties of the gasket itself also prevent access of environmental contaminants, such as moisture vapor, into the container. A key property of the cured gasket is low moisture transmissivity that can be attributed to the use of a liquid prepolymer that includes a hydrophobic semicrystalline polymer filler. Liquid prepolymers can be hydrophobic and can impart hydrolytic stability and minimal moisture absorption to cured gaskets. The liquid prepolymers can include components useful for forming flexible epoxy polymers such as epoxidized olefins and diols and components useful for forming flexible acrylic polymers, such as acrylic oligomers and reactive monomers, dimers, trimers, and other useful crosslinkers.

The flexible polymer of the provided gasket can be made from suitable liquid prepolymers. When the flexible polymer is an epoxy polymer, the liquid prepolymers can include substantially linear hydrocarbon such as L-207, a commercially available epoxidized block copolymer, from Kuraray Co., Tokyo, Japan. This dual functional oligomer consists of a poly(ethylene/butylene) backbone with hydroxyl functionality at one end and a multiple epoxidized polyisoprene functionality at the other end. The flexible aliphatic portion imparts low temperature flexibility as well as hydrophobicity. The multiple-epoxidized end allows for epoxy-type curing and network formation. Other useful liquid prepolymers include epoxidized alpha-olefins such as, for example, those known under the trade designation VIKOLOX that are available from Arkeme, Inc., Blooming Prairie, Minn. The liquid prepolymers include monomers such as those known under the trade designation HELOXY which is a diglycidyl ether of cyclohexane dimethanol and is available from Hexion Specialty Chemicals, Columbus, Ohio; EPON 872, a modified bis-phenol A, also available from Hexion; diols such as those known under the trade designation, PRIPOL and available from Croda, Inc., Edison, N.J.

Curing agents for two part epoxy systems, can be liquid anhydrides, such as AC39-polypropylene glycol di(dodecenyl succinate); dodecenyl succinic anhydride (DDSA); methyl tetrahydro-phthalic anhydride (MTHPA); methyl-5-norbornene-2,3,-dicarboxylic anhydride (AC methyl); methylhexahydro-phthalic anhydride (MHHPA); octenyl succinic anhydride (OSA), alkenyl succinic anhydride 1618 ASA (available from Albemarle Corp., Baton Rouge, La.) and combinations thereof. Liquid maleic anhydride grafted polybutadiene may also be used as a curing agent. Both one part and two part epoxy systems can cure by exposure to heat.

Addition of a reactive diluent, such as PRIPOL 2033, a dimer diol, can reduce the viscosity of the overall formulation and can also maintain performance properties by reacting into the network structure. Other useful reactive diluents for epoxy systems include hydroxyl functional compounds, such as hydroxyl terminated poly(ethylene/butylene), available as L-2203 from Shell Chemical; hydroxyl terminated polybutadiene resin available as R-20LM from ElfAtochem; low viscosity epoxy functional compounds, such as diglycidyl ether of 1,4-butanediol available as HELOXY MODIFIER 67 from Hexion; and diglycidyl ether of neopentyl glycol available as HELOXY MODIFIER 68 from Hexion. Epoxy systems that are suitable for form-in-place gaskets are disclosed, for example, in U.S. Pat. No. 6,346,330 (Huang et al.).

Components that are useful for forming flexible acrylic polymers useful in the provided articles and methods include components for forming urethane acrylates, polyester acrylates, acrylates with plasticizers, and other acrylates that have elongations of at least 20% and glass transition temperatures ($T_g$) of less than about 10° C. Components for forming flexible urethane acrylates typically include one or more urethane(meth)acrylate oligomers. These oligomers are commercially available from, for example, Sartomer Co. Other useful urethane (meth)acrylate oligomers include those commercially available from Henkel Corp, Hoboken, N.J. under the trade designation PHOTOMER, and those available from UCB Radcure Inc., Smyrna, Ga. under the trade designation EBECRYL. Useful urethane (meth)acrylate oligomers can be characterized as having an elongation of at least 20% and typically no greater than 200%; a $T_g$ ranging from about 0 to 70° C.; and a tensile strength of at least 1,000 psi, or at least 5,000 psi. One or more urethane (meth)acrylate oligomers can be combined with at least one multi(meth)acrylate monomer comprising three or four (meth)acrylate groups. The multi(meth)acrylate monomer increases the crosslinking density and thereby predominantly contributes the durability and abrasion resistance to the cured gasket material.

Suitable tri(meth)acryl containing compounds include glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), trimethylolpropane triacrylate, pentaerythritol triacrylate, and tris(2-hydroxyethyl)isocyanurate triacrylate. Higher functionality (meth)acryl containing compounds include ditrimethylolpropane tetraacrylate, ethoxylated (4) pentaerythritol tetraacrylate, and pentaerythritol tetraacrylate.

The oligomers can be combined with cross-linkable monomers to form a liquid prepolymer composition. Commercially available cross-linkable acrylate monomers include those available from Sartomer Company, Exton, Pa. such as trimethylolpropane triacrylate available under the trade designation SR351, pentaerythritol triacrylate available under the trade designation SR444, dipentaerythritol triacrylate available under the trade designation SR399LV, ethoxylated (3) trimethylolpropane triacrylate available under the trade designation SR454, ethoxylated (4) pentaerythritol triacrylate, available under the trade designation SR494, and tris(2-hydroxyethyl)isocyanurate triacrylate, available under the trade designation SR368.

The prepolymer composition may additionally comprise one or more di(meth)acryl containing compounds. For example, the urethane (meth)acrylate oligomer may be purchased preblended with a di(meth)acrylate monomer such as in the case of "CN988B88". Suitable monomers include for example 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecanedimethanol diacrylate, triethylene glycol diacrylate, and tripropylene glycol diacrylate.

Polyester acrylates can be made from precursor mixtures of mono(meth)acrylate functional polyester oligomers that are branched or essentially linear, and the (meth)acrylate functional group or groups, respectively, can be terminal groups and/or pendant side groups bonded to the oligomer backbone. Mono(meth)acrylate functional polyester oligomers can be obtained, for example, by polymerizing cyclic esters such as, for example, ε-caprolactone or pivalolactone using α, θ-hydroxy-(meth)acrylate functional compounds such as hydroxyethyl acrylate (HEA) or hydroxyethyl methacrylate (HEMA) as a starter or termination compound. The reaction provides an α, θ-hydroxy-mono(meth)acrylate functional polyester oligomer compound.

The addition of at least one hydrophobic filler can add resistance to moisture transmission. Fillers useful in the present invention for providing added resistance to moisture transmission include semicrystalline polymers, typically in the form of a fine powder, a micropowder. The term semicrystalline implies that the polymer has separate phases or domains of crystalline regions and non-crystalline regions, i.e. amorphous regions. Semicrystalline polymers can exist as viscous liquids at temperatures above the melting point of the crystals. Upon cooling, crystals nucleate and grow to fill the available volume. The reason these materials are called semicrystalline is that some fraction of the polymer remains un-crystallized or, amorphous when the polymer is cooled to room temperature. The semicrystalline polymers typically have a melting point above 20° C., preferably above 50° C. and most preferably above 100° C. or higher. The degree of crystallinity, i.e. the fraction of the semicrystalline polymer that comprises the crystalline phase, can be greater than 10%, greater than 20%, greater than 30%, greater than 40% and even greater than 50% based on weight or volume. The degree of crystallinity is preferably greater than 20%, more preferably greater than 30% and most preferably greater than 40% based on weight or volume. The micropowder, thermoplastic polymers can have particles with an average particle size (average largest diameter) of from about less than 50 µm, LyondellBassell less than about 25 µm, less than about 10 µm, or even less than about 5 µm.

Typically, the filler includes at least one hydrophobic semicrystalline polymer. The filler typically comprises a polyolefin or a fluoropolymer. The filler can have microcrystalline domains. Exemplary polyolefin fillers that are useful in the provided gaskets include polyolefins such as polyethylene, polypropylene, poly-alpha-olefins, mixtures including polyolefins, and substituted derivatives of polyolefins. High density polyolefins are typically utilized. Exemplary polyolefins that are useful in the provided gaskets include polyolefins available under the tradename MICROTHENE F FA 700-00 and MICROTHENE F FP 800-00 both from LyondellBassell Chemical Company, Houston, Tex.

Fluoropolymers that are useful as fillers in the provided articles typically have semicrystalline domains and have fluorine atoms attached to the polymer's carbon backbone and/or side chain. Exemplary fluoropolymer fillers that are useful in the provided gaskets include polytetrafluoroethylene (PTFE), ETFE (a copolymer comprising ethylene and tetrafluoroethylene), FEP (a copolymer comprising hexafluoropropene and tetrafluoroethylene), polyvinyl fluoride, polyvinylidiene fluoride, THV fluoropolymers (copolymers comprising tetrafluoroethylene, hexafluoropropene and vinylidene fluoride) and PFA (a copolymer comprising tetrafluoroethylene and perfluorovinylether). Exemplary materials that are useful in the provided gaskets include fluoropolymers available under the trade designation, J-14, a microfine fluororopolymer powder available from Dyneon LLC, Oakdale, Minn.; THV 220, THV 500, THV 610 and THV 815 fluororopolymers available from Dyneon LLC; ZONYL fluoroadditives, such as MP-1300, available from DuPont Fluoroproducts, Wilmington, Del. Other semicrystalline thermoplastics that may be useful in the provided gaskets include polyvinyl chloride, polyvinylidene chloride, poly(chlorotrifluoro ethylene), Polyterephthalates, such as polyethylene terephthalate and polybutylene terephthalate and semicrystalline thermoplastics commonly classified as nylon, e.g. Nylon 11, Nylon 6 and Nylon 66.

The addition of micropowder, semicrystalline, fillers to the provided articles can impart substantial resistance to moisture transmission to the gasket. The resistance to moisture transmission of polymers is typically measured as the moisture vapor transmission rate (MVTR) and tests for making that measurement are discussed below. Typically, the fillers are in the form of micropowders and are made of hydrophobic semicrystalline material. But, although not being bound by theory, it is believed that the improved MTVR of the gasket material that includes at least hydrophobic filler is largely due to the hydrophobic nature of the semicrystalline polymers, the crystalline nature of the polymer, wherein the crystals act as physical barriers to the transmission of moisture vapor through the gasket, and the amount of the filler in the gasket, moisture resistance increasing with increasing filler content. Typically, the hydrophobic semicrystalline polymer filler is present in greater than about 15 wt %, greater than about 20 wt %, greater than about 30 wt %, greater than about 40 wt %, greater than about 50 wt %, or even greater than about 60 wt % of the total amount of gasket material.

Form-in-place gasket formulations need to be easy to apply through manual or automated dispensing systems. However, after applying the uncured gasket formulation to the container to be sealed, the gasket formulations should be non-slumping. Non-slumping form-in-place gasket formulations include small amounts of additional filler particles known to produce thixotropic materials. These materials can be added into the uncured gasket material in an amount of less than about 15 wt %, less than about 10 wt %, less than about 5 wt %, or even less than about 2 wt % of the total amount of gasket material. After dispensing in a pre-determined pattern, these filled formulations can maintain their profile and dimensions through thermal curing. Suitable additional fillers according to the present invention include clays, a variety of forms of silica, depending upon particle size and surface treatment, and organic fillers such as cellulose, castor-oil wax, and polyamide-containing fillers. Particulate fillers, imparting thixotropy, include fumed silica, fused silica, clay, and carbon black. Suitable fumed silicas include AEROSIL R 812, AEROSIL R 711 and AEROSIL R 805 (available Evonik Industries, Pasippany, N.J.); CAB-O-SIL TS 610; and CAB-O-SIL T 5720 (both available from Cabot Corp.). Typical clays include GARAMITE 1958, available from Southern Clay Products. Carbon blacks, such as COLOUR BLACK FW 18 (Degussa); and PRINTEX 55 also contribute to thixotropy. Fumed silicas generally represent the most typically used fillers although this is somewhat formulation dependent.

Optimum rheological performance occurs with proper dispersion of the filler. Shear conditions, during mixing of form-in-place gasket formulations, approach an optimum state to produce material for uncured gaskets that hold their shape after dispensing. High shear mixing can permanently disrupt the network structure of the thixotropic particles with resultant loss of shape by increased slumping of dispensed gasket beads. A low-shear mixer can reduce this problem and can be used for preparing formulations useful in making the provided articles.

In addition to repelling external contaminants, the gasket itself should not represent a potential source of contamination. It is desirable that the hydrophobic gasket material exhibits remarkable stability and freedom from volatile components that could escape, via outgassing, to deposit on electronic components in the container with resultant potential for corrosion or other damaging conditions. Stringent cleanliness is highly desired by electronics manufacturers, particularly in the hard disk drive industry. Therefore, the cured gasket should contain minimal amounts of impurities and volatile components. Gasket formulations typically have cure times of at least two hours at 120° C. In some embodiments, the cure time can be shorter depending upon the monomers chosen and the curing agents. Additional reduction of outgassing can occur via a post-bake process after curing.

For optimum performance in a designated application, form-in-place gaskets typically possess a balance of properties. Uncured gasket formulations can be liquid with a low enough viscosity for easy dispensing, yet remain non-slumping, after dispensing, to maintain the shape and dimensions of a selected gasket pattern. Low filler concentrations favor lower viscosity formulations for improved dispensability. Formulations with insufficient filler amounts typically result in gasket beads that slump excessively after being dispensed. Each property may vary depending upon material selection and stoichiometry, filler type and concentration, and conditions used for crosslinking a formulation to yield the cured gasket. The balance of properties will vary in response to the specific requirements of a given application for form-in-place gaskets. Custom formulating becomes an essential task for satisfying the many applications for gasket formulations according to the present invention.

The provided articles can be useful for enclosing environmentally sensitive electronic devices in a container that can isolate them from unfriendly environmental conditions such as moisture, particulate contamination, corrosive chemicals, etc. Electronic devices that are typically protected in this manner and can benefit from being enclosed in a provided container include hard disk drives for computers, personal handheld devices, electronic circuits, light-emitting diodes, and other sensitive electronics. The container can be made of metal, polymer, glass, ceramic or any solid material that can withstand the operating conditions of the electronic device placed therein.

Turning to the figures, FIG. 1 is a perspective exploded view of an embodiment of a provided housing for an electronic device. Housing 100 is a container for a hard disk drive and includes first section 110 that fits snugly inside and against the bottom of second section 120 when the container is closed. Gasket 130 is in contact with the mating surface 120 of the second section. After an electronic device is inserted into the container, the container can be closed and held together by fastening means such as screws, bolts, or clamps. In the embodiment illustrated in FIG. 1, the fastening means can be screws that are tightened after being inserted into screw holes 140.

Figure 2:
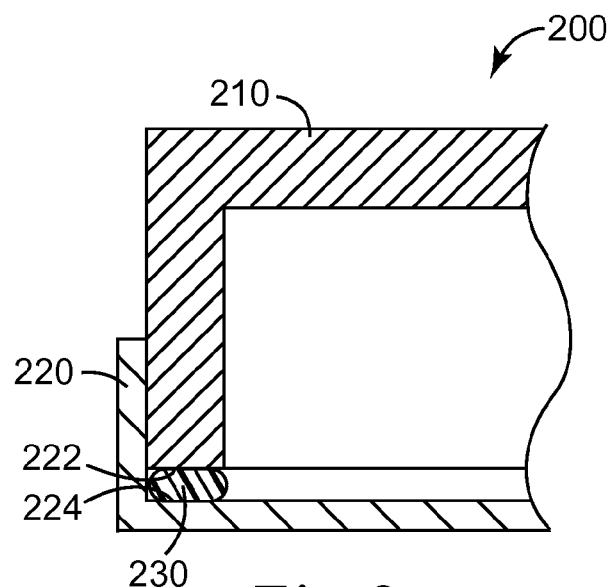
FIG. 2 is a partial cross-sectional view of a provided housing for an electronic device.

FIG. 2 is a partial cross-sectional view of an embodiment of a provided housing for an electronic device shown in FIG. 1. Housing 200 is in its sealed position and includes first section 210 of a container with first mating surface 222 in contact with gasket 230 which has been compressed when the container is closed. Gasket 230 is in contact with second mating edge 224 of second section 220 of a container. When sealed, the gasket reduces moisture transmissivity from the outside of the container to the inside of the container which encloses an electronic device.

Figure 3:
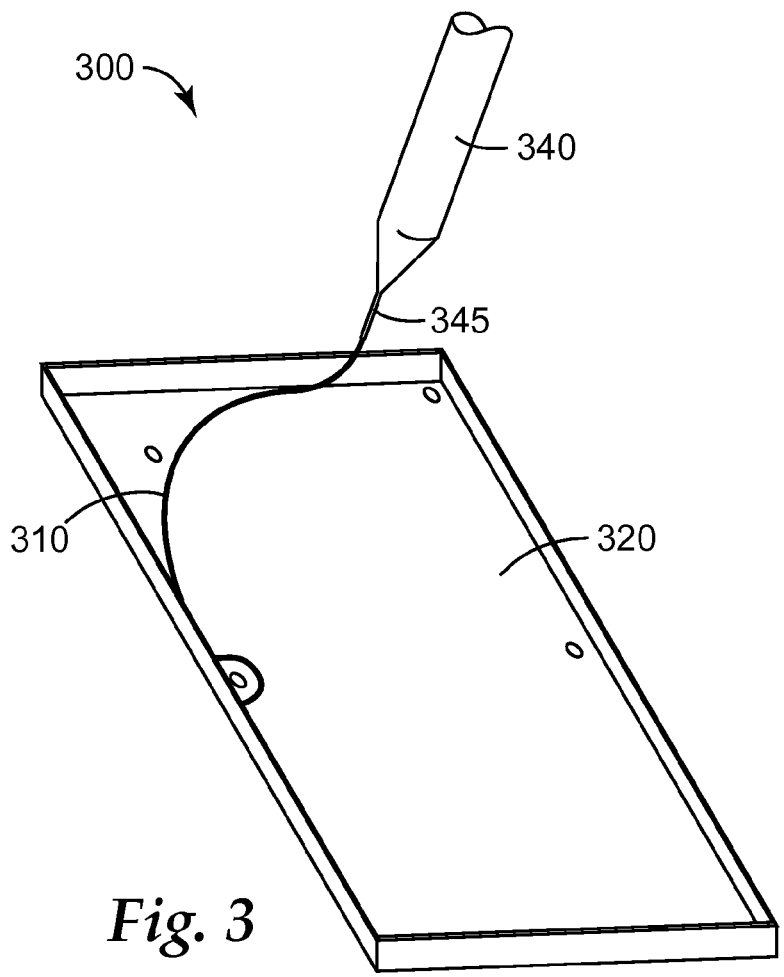
FIG. 3 is a perspective view of a part of a method of forming a gasket.

FIG. 3 illustrates a method of application of the provided gasket material. The method is illustrated by drawing 300 that shows a section of a container 320 into which a bead of gasket material 310 is in the process of being applied. The bead of gasket material is dispensed through nozzle 345 from dispenser 340 so that the gasket material makes contact with a mating surface of the container.

Objects and advantages of this invention are further illustrated by the following examples, but the particular materials and amounts thereof recited in these examples, as well as other conditions and details, should not be construed to unduly limit this invention.

EXAMPLES

Materials

The materials used in the Comparative Examples and the Examples are shown below in Table 1.

TABLE 1

Materials

| IDENTIFICATION | DESCRIPTION |
| --- | --- |
| L-207 | An epoxy functionalized olefin available under the trade designation "L-207" available from Kuraray, Co Ltd, Tokyo, Japan. |
| VIKOLOX 14 | An epoxidized alpha olefin available under the trade designation "VIKOLOX 14" from Arkema, Inc., Blooming Prairie, Minnesota. |
| HELOXY 107 | A diglycidyl ether of cyclohexane dimethanol available under the trade designation "HELOXY 107" from Hexion Specialty Chemicals, Columbus, Ohio. |
| P107 | A purified HELOXY 107, via a chemical and distillation procedure to remove residual ionic halogen content discussed in U.S. Pat. No. 6,528,169 (Charles et al.) |
| PRIPOL 2033 | A dimer diol available under the trade designation "PRIPOL 2033" from Croda, Inc., Edision, New Jersey. |
| CN2273 | A polyester acrylate oligomer available under the trade designation "CN2273" from Sartomer Company, Inc., Exton, PA |
| CN3108 | A specialty oligomer/urethane acrylate blend available under the trade designation "CN3108" from Sartomer Company, Inc. |
| R 805 | A fumed silica available under the trade designation "Aerosil R805" from Evonik Industries, Pasippany, New Jersey. |
| R 711 | A methacrylsilane treated fumed silica available under the trade designation "Aerosil R 711" from Evonik Industries. |
| NaCure | An ammonium antimony hexafluoride available under the trade designation "NaCure Super XC-7231" from King Industries, Norwalk, Connecticut. |
| NaCure Solution | A mixture of 80 wt. % P107 and 20 wt. % NaCure. |
| BP | Benzoyl peroxide available from Aldrich Chemical Company, Inc., |

TABLE 1-continued

Materials

| IDENTIFICATION | DESCRIPTION |
|---|---|
| | Milwaukee, Wisconsin. |
| J-14 additive | A PTFE micropowder available under the trade designation "J-14" from Dyneon LLC, Oakdale, Minnesota. |
| MP 1300 additive | A fluoroadditive available under the trade designation "ZONYL MP 1300" from DuPont Fluoroproducts, Wilmington, Delaware. |
| FA 700-00 additive | A microfine polyolefin powder available under the trade designation "MICROTHENE F FA 700-00" from LyondellBassell Chemical Company, Houston, Texas. |
| FA 800-00 additive | A microfine polyolefin powder available under the trade designation "MICROTHENE F FP 800-00" from LyondellBassell Chemical Company. |
| FIPG 8505 | A form-in-place gasket material available under the trade designation "3M FORM-IN-PLACE GASKET 8505" from 3M Company, St. Paul, Minnesota. |

Method 1A: Liquid Gasket Composition Preparation-1

Liquid gasket compositions according to Table 2A were prepared. For a given composition, the liquid resin components, i.e. epoxy resin(s) and diol(s), were charged to a clear, mix container, a MAX 200, available from FlackTek Inc., Landrum, S.C., and mixed using a Hauschild SPEED-MIXER DAC 600 FV operating at 2200 rpm for 2 minute. The silica was then charged to the mix container and mixed at 2200 rpm for 2 minute. The mix container was opened to scrap material down from the container sides. The mix container was re-closed and mixed for an additional 4 minutes at 2200 rpm. The appropriate additive, e.g. J-14 additive, was then charged to the mix container and mixed at 2200 rpm for 2 minute. The NaCure solution was then charged to the mix container and mixed at 2200 rpm for 1 minute. To degas the mixture, the container lid was replaced with an identical lid that had been modified to have a small whole in the center, fitted with a quick connect valve. The container was connected to a vacuum pump and the container was exposed to a vacuum of 29-30 mm Hg for about 30 seconds. The quick connect valve was disconnected from the vacuum, maintaining the contents of the container under vacuum. The container was placed back into the SPEED-MIXER and mixed for 1 minute at 2200 rpm. This process was repeated until no bubbles were observed in the material in the mix container during evacuation, yielding a liquid gasket composition. The mass of the components were selected such that weight of the liquid gasket composition was about 150 gm.

TABLE 2A

Liquid Gasket Compositions (wt %)

| Component | Comparative Example A | Example 1 | Example 2 | Example 3 |
|---|---|---|---|---|
| L-207 | 41.76 | 31.32 | 20.88 | 14.62 |
| VIKOLOX 14 | 13.49 | 10.12 | 6.75 | 4.72 |
| P107 | 0.64 | 6.48 | 4.32 | 3.02 |
| PRIPOL 2033 | 21.42 | 16.07 | 10.71 | 7.50 |
| R-805 | 14.24 | 10.68 | 7.12 | 4.98 |
| NaCure Solution | 0.45 | 0.34 | 0.23 | 0.16 |
| J-14 Additive | — | 25.00 | 50.00 | 65.00 |

Method 1B: Liquid Gasket Composition Preparation-2

Liquid gasket compositions according to Table 2B and 2C were prepared. For a given composition, the FIPG 8505 and additive was charged to a clear, mix container, a Max 200, from FlackTek Inc., Landrum, S.C. and mixed at 2200 rpm for 2 minute. The mix container was opened to scrap material down from the container sides. The mix container was re-closed and mixed for an additional 4 minutes at 2200 rpm. Degassing of the mixture followed the degassing procedure described in Method 1A. The mass of the components were selected such that weight of the liquid gasket composition was about 150 gm.

TABLE 2B

Liquid Gasket Compositions (wt. %)

| Component | Ex. 4 | Ex. 5 | Ex. 6 | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|---|---|---|
| FIPG 8505 | 64.78 | 64.78 | 80.81 | 80.81 | 60.00 | 60.00 | 77.45 | 77.45 | 50.00 | 50.00 | 69.60 | 69.60 |
| J-14 additive | 35.22 | — | — | — | 40.00 | — | — | — | 50.00 | — | — | — |
| MP 1300 additive | — | 35.22 | — | — | — | 40.00 | — | — | — | 50.00 | — | — |
| FA 700-00 additive | — | — | 19.19 | — | — | — | 22.55 | — | — | — | 30.40 | — |
| FA 800-00 additive | — | — | — | 19.19 | — | — | — | 22.55 | — | — | — | 30.40 |

TABLE 2C

| | Liquid Gasket Compositions (wt. %) | | | | | | | |
|---|---|---|---|---|---|---|---|---|
| Component | Ex. 16 | Ex. 17 | Ex. 18 | Ex. 19 | Ex. 20 | Ex. 21 | Ex. 22 | Ex. 23 |
| FIPG 8505 | 83.33 | 80.00 | 70.00 | 65.00 | 60.00 | 50.00 | 40.00 | 35.00 |
| J-14 additive | 16.67 | 20.00 | 30.00 | 35.00 | 40.00 | 50.00 | 60.00 | 65.00 |

Method 1C: Liquid Gasket Composition Preparation-3

Liquid gasket compositions for Examples 24 and 25, Table 2D, were prepared. The CN2273 and the BP were charged to a clear, mix container, as described in Method 1A, and mixed for 8 min at 2200 rpm. The sealed container was then left for 18 hrs. For Example 25, the R 711 was then charged to the container and mixed 2 min at 2200 rpm. This step was omitted for Example 24. The mix container was opened to scrap material down from the container sides. The mix container was re-closed and mixed for an additional 4 minutes at 2200 rpm. The additive was charged to the mix container and mixed at 2200 rpm for 2 minute. The mix container was opened to scrap material down from the container sides. The mix container was re-closed and mixed for an additional 4 minutes at 2200 rpm. Degassing of the mixture followed the degassing procedure described in Method 1A, yielding the liquid gasket composition. For Example 26, the CN3108 and the additive were to a clear, mix container, as described in Method 1A. Then the samples were mixed for 2 min at 2200 rpm using the mixer described in Method 1A. The mix container was opened to scrap material down from the container sides. The mix container was re-closed and mixed for an additional 4 minutes at 2200 rpm. Next, BP was charged to the mix container and mixed for 1 min at 2200 rpm. Degassing of the mixture followed the degassing procedure described in Method 1A, yielding the liquid gasket composition. For Example 27, CN3108 and R 711 were then charged to the container and mixed 2 min at 2200 rpm. The mix container was opened to scrape material down from the container sides. The mix container was re-closed and mixed for an additional 4 minutes at 2200 rpm. The additive was then charged to the mix container and mixed for 2 minutes at 2200 rpm. The mix container was opened to scrape material down from the container sides. The mix container was re-closed and mixed for an additional 4 minutes at 2200 rpm. Next, the BP was charged to the mix container and mixed for 1 min at 2200 rpm. Degassing of the mixture followed the degassing procedure described in Method 1A, yielding the liquid gasket composition. The mass of the components were selected such that weight of a given liquid gasket composition was about 150 gm.

TABLE 2D

| | Liquid Gasket Compositions (wt %) | | | |
|---|---|---|---|---|
| Component | Example 24 | Example 25 | Example 26 | Example 27 |
| CN2273 | 64.36 | 58.56 | — | — |
| CN3108 | — | — | 64.36 | 58.56 |
| BP | 0.64 | 0.59 | 0.64 | 0.59 |
| R 711 | — | 5.86 | — | 5.86 |
| J-14 Additive | 35.00 | — | 35.00 | — |
| FA 700-00 Additive | — | 35.00 | — | 35.00 |

Method 2: Gasket Formation and Cure

The liquid gasket composition, as described in Method 1A, 1B, or 1C was removed from the mix container and placed in a 30 ml syringe for dispensing. A 16 gauge, 32 mm (1.25 inch) length SMOOTHFLOW Tapered Tip needle with 1.19 mm (0.047 inch) inside diameter from EFD, Inc., East Providence, R.I. was attached to the syringe. The syringe was fitted into a CAM/ALOT model number 1818 liquid dispensing system available from Camelot systems, Inc. Haverhill, Mass. A bead, i.e. a line of the liquid gasket composition, with an approximate spherical cross section having a diameter of about 1.14 mm (0.045 inch), was dispensed onto the fixture base, 420, in the shape of a circular ring. The ring diameter was about 57 mm. The fixture base was placed in an air flow through oven at a set temperature of 120° C. for 3 hours to cure the liquid gasket composition into a solid gasket. The fixture base was removed for the oven and allowed to cool to room temperature, typically, at least several hours. For examples 24-27, the bead of liquid resin composition was dispensed onto an aluminum plate. Curing was conducted at a set temperature of 120° C. for 1 hour to cure the liquid gasket composition into a solid gasket.

Method 3: Humidity Measurements

Figure 4:
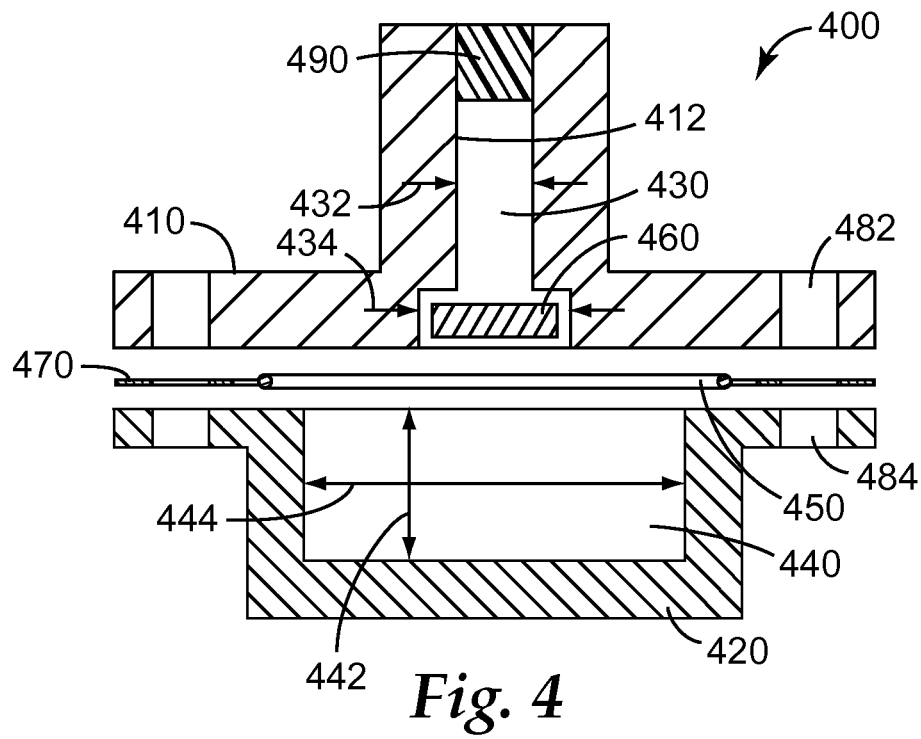
FIG. 4 is a cross-sectional view of a test fixture.
Figure 4A:
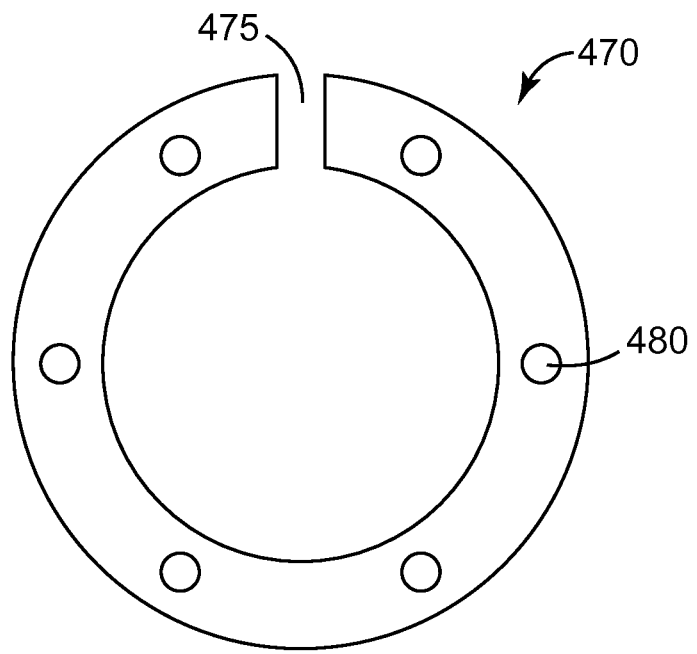
FIG. 4A is a top-down view of a metal shim used on the test fixture of FIG. 4.

Test Fixtures:

A test fixture was required to perform the relative humidity measurements. A cross sectional view of the test fixture is shown in FIG. 4. The test fixture, 400, comprised a fixture cap, 410, and fixture base, 420, which were fabricated from stainless steel, although other non-corrosive metals would be suitable. The fixture cap, 410, had a fixture cap cavity, 430, defined by fixture cap sidewall, 412. The fixture base, 420, had a fixture base cavity, 440. The two cavities combine to form a total fixture cavity volume. The fixture base had a fixture base cavity, 440 defined by the base cavity depth, 442, and base cavity diameter, 444. The total volume of the fixture can be modified by changing the dimensions of the fixture base cavity, 440, or the dimensions of the fixture cap cavity, 430, or both. For the fixture base, this can be accomplished by modifying the base cavity depth, 442, and/or base cavity diameter, 444. Although the fixture used herein was circular when viewed from a top view perspective, yielding cylindrical shaped cavities, almost any cavity shape is acceptable. The important factor is having the total fixture cavity volume similar in size and having a gasket of similar length, i.e., the cavity volume/gasket length ratio being constant for a given set of measurements. If the cavity volume/gasket length ratio is changed, it is expected that useful results can still be obtained. However, the absolute values of the relative humidity may change. For the present studies, the base cavity depth, 442, and base cavity diameter, 444 along with the fixture cap cavity volume were selected to create a total fixture cavity volume of about 12.8 cm$^3$. The fixture cavity volume/gasket length ratio was about 0.72 cm$^3$/cm. The dimensions of the fixture base were selected such that a bead of a liquid gasket composition, 450, in the shape of a circular ring, could be placed on the fixture base and cured. The diameter of the circular ring of liquid gasket composition was about 57 mm and had a diameter greater than the base cavity diameter, 444. The fixture cap cavity, 430, has a first cap cavity diameter, 432 and a second cap cavity diameter, 434. The second cap cavity diameter, 434, was larger than the first, 432. The second cap cavity diameter, typically about 17-18 mm, was of sufficient size to enable the placement of a temperature/humidity logger, i.e. and iButton, 460, inside it. Additionally, the fixture cap, 410, has a fixture plug, 490. The plug has close tolerances with the fixture cap sidewall, 412. The plug may have threads. Prior to inserting the plug, 490, into the fixture cap, 420, an adhesive, 3M SCOTCH-WELD epoxy adhesive DP190, available from the 3M Company, St. Paul, Minn., was placed on the plug surfaces that would be adjacent to the fixture cap sidewall, 412. The plug with adhesive was inserted into the fixture cap and the adhesive was allowed to cure at ambient conditions. This formed a hermetic seal between the plug, 490, and the fixture cap sidewall, 412. A slotted, metal shim, 470, was placed between the fixture cap, 410 and fixture base, 420, prior to assembly. FIG. 4A shows a top view of the metal shim, 470, having slot, 475, and six though holes, 480. The fixture cap, 410, and fixture base, 420, also have six through-holes, 482 and 484, respectively. Fixture cap through-holes, 482, are typically threaded to enable fastening of the fixture cap to the fixture base via threaded screws. The through-hole dimensions and placement within the fixture cap and fixture base are of similar configuration as to those of the slotted shim, enabling alignment of all the through-holes during fixture assembly.

Measurements:

A temperature/humidity logger; an iButton Model number DS1923 from Maxim Integrated Products, Sunnyvale, Calif.; was placed in the fixture cap with solid gasket, as prepared in Method 2. A slotted, metal shim having a thickness of about 75% of the solid gasket thickness was place on the fixture cap with the through-holes of the cap matching with the through-holes of the shim. Shim thickness varies with gasket thickness but was typically from 1.02-1.27 mm (40-50 mils). The inner diameter of the shim was larger than the outer diameter of the gasket to insure that there was no contact between the shim and gasket, even when the gasket was compressed. The fixture base was then attached to the fixture cap by use of six threaded screws. The screws fit through the through-holes of the fixture base and shim and then were threaded to the fixture cap through-hole threads. Although threaded screws were used, any appropriate clamping or attaching device or mechanism may be used to hold the fixture together. The screws were not tightened completely, allowing exposure of the fixture cavity to the surrounding atmosphere. The pre-assembled fixture cap/iButton, fixture base and slotted shim were then placed in a controlled temperature/humidity room (22° C./0.1% relative humidity) for 1 hour. Without removing from the temperature/humidity room, the screws were tightened until the fixture cap, shim and fixture base were in contact, compressing the gasket to approximately 75% of its original thickness. The sealed fixture was then placed in a temperature controlled humidity chamber at a set temperature of 60° C. and 85% relative humidity (set point). The iButton temperature/humidity logger recorded a data point approximately once per hour. The fixture remained in the chamber for approximately 140 hours. The fixture was removed from the chamber, cooled to room temperature and opened to recover the iButton. Relative humidity data as a function of time was retrieved from the DS1923 iButton by using an iButton reader/probe, model number DS1402BD-DR8 from Maxim Integrated Products.

For each composition listed in Table 2A, a separate fixture was prepared and tested for moisture permeation through the solid gasket material via the monitoring of the relative humidity. Two comparative examples, i.e. two fixtures, having liquid gasket composition A were prepared from the same mixture. They were designated comparative example A1 and A2, respectively.

Results

Relative humidity values at various times for the gasket compositions of Table 2A are shown in Table 3. For a given time, the relative humidity measurement was typically the average of four to five data points, the relative humidity at the indicated time plus the three to four preceding points. The data of Table 3 shows a significant reduction in the relative humidity within the fixture, i.e. a lowering of moisture permeation through the solid gasket, upon addition of the J-14 additive to the gasket.

TABLE 3

Percent Relative Humidity vs. Time
(measured in hours from 85% relative humidity chamber)

| Time (hrs) | Comparative Example A1 | Comparative Example A2 | Example 1 | Example 2 | Example 3 |
|---|---|---|---|---|---|
| 0 | 28.2 | 27.4 | 32.4 | 32.7 | 34.6 |
| 5 | 36.3 | 35.6 | 40.1 | 38.0 | 32.6 |
| 9 | 40.0 | 38.8 | 41.8 | 40.7 | 35.4 |
| 14 | 42.6 | 41.9 | 43.3 | 41.5 | 37.1 |
| 19 | 44.1 | 43.6 | 43.8 | 42.9 | 38.7 |
| 23 | 45.4 | 44.8 | 44.1 | 43.1 | 39.5 |
| 28 | 46.2 | 45.7 | 45.5 | 43.0 | 39.6 |
| 32 | 47.7 | 47.7 | 46.2 | 44.0 | 40.7 |
| 37 | 48.5 | 48.6 | 45.9 | 44.9 | 41.2 |
| 42 | 49.3 | 49.4 | 46.7 | 44.8 | 42.1 |
| 46 | 49.8 | 49.8 | 46.6 | 45.6 | 42.0 |
| 51 | 49.7 | 49.8 | 47.5 | 45.2 | 42.6 |
| 56 | 50.4 | 50.6 | 47.9 | 46.3 | 42.6 |
| 60 | 50.7 | 51.2 | 47.9 | 45.7 | 43.4 |
| 65 | 51.3 | 51.2 | 48.5 | 46.3 | 43.5 |
| 69 | 51.1 | 51.4 | 48.2 | 46.4 | 44.2 |
| 74 | 51.6 | 51.7 | 49.1 | 46.7 | 44.0 |
| 79 | 52.0 | 52.2 | 49.4 | 47.1 | 44.4 |
| 83 | 51.8 | 52.7 | 49.3 | 47.2 | 44.9 |
| 88 | 52.7 | 53.2 | 48.7 | 47.7 | 45.4 |
| 93 | 52.9 | 53.2 | 50.2 | 47.5 | 45.4 |
| 97 | 53.1 | 53.7 | 50.1 | 47.8 | 45.7 |
| 102 | 53.2 | 53.7 | 50.6 | 48.1 | 45.7 |
| 106 | 53.4 | 53.8 | 50.9 | 48.2 | 45.4 |
| 111 | 54.0 | 53.9 | 51.0 | 48.3 | 46.2 |
| 116 | 53.5 | 54.1 | 51.0 | 48.5 | 46.1 |
| 120 | 53.7 | 54.8 | 51.3 | 49.0 | 46.7 |
| 125 | 54.4 | 54.6 | 51.0 | 48.6 | 46.7 |
| 130 | 54.6 | 54.2 | 51.2 | 47.9 | 46.7 |
| 134 | 55.0 | 55.7 | 51.8 | 48.5 | 46.9 |

Although the above test method was used, it is thought that any appropriate method for measuring the moisture permeability through the solid gasket, whether it is a relative humidity measurement akin to that described above or moisture permeability, e.g. ASTM F1249 ("Standard Test Method for Water Vapor"), would produce appropriate data to demonstrate the benefit of the present invention.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited within this disclosure are herein incorporated by reference in their entirety.

What is claimed is:

1. An article for housing an electronic device comprising:
   a container having at least a first section and a second section, the first section having a first mating surface and the second section having a second mating surface; and
   a gasket in contact with the first mating surface and the second mating surface, wherein the gasket comprises:
   a flexible polymer; and
   a filler, and wherein the filler includes at least one hydrophobic semicrystalline polymer.

2. An article according to claim 1, wherein the flexible polymer comprises an acrylate polymer, an epoxy polymer, or a combination thereof.

3. An article according to claim 2, wherein the epoxy polymer is the reaction product of a two part epoxy system.

4. An article according to claim 2, wherein the epoxy polymer is the reaction product of a one part epoxy system.

5. An article according to claim 1, wherein the filler comprises a micropowder.

6. An article according to claim 1, wherein the at least one hydrophobic semicrystalline polymer has microcrystalline domains.

7. An article according to claim 1, wherein the at least one hydrophobic semicrystalline polymer comprises a polyolefin.

8. An article according to claim 1, wherein the at least one hydrophobic semicrystalline polymer is at least partially fluorinated.

9. An article according to claim 8, wherein the fluorinated polymer comprises poly(tetrafluoroethylene).

10. An article according to claim 1, wherein the filler comprises greater than about 20 wt % of the gasket.

11. An article according to claim 1, further comprising an electronic device.

12. An article according to claim 11, wherein the container and the gasket completely enclose the electronic device.

13. An article according to claim 11, wherein the electronic device comprises a hard disk drive.

14. A method of sealing an electronic device comprising:
providing a container having at least a first section and a second section, the first section having a first mating surface and the second section having a second mating surface;
locating the electronic device in the first section of the first container;
applying a bead of gasket precursor material to the first mating surface of the first section of the container;
curing the bead of gasket precursor material to form a cured gasket; and
placing the second section of the container such that the second mating surface of the second container comes into contact with the cured gasket and such that the first section of the container and the second section of the container at least partially surround the electronic device wherein the gasket comprises:
a flexible polymer; and
a filler, and
wherein the filler includes at least hydrophobic semicrystalline polymer.

15. A method according to claim 14, wherein the filler comprises a micropowder.

16. A method according to claim 14 wherein the at least one hydrophobic semicrystalline polymer has semicrystalline domains.

17. A method according to claim 14, wherein the at least one hydrophobic semicrystalline polymer is at least partially fluorinated.

18. A method according to claim 14, wherein the at least one hydrophobic semicrystalline polymer comprises a polyolefin.

19. A method according to claim 17, wherein the hydrophobic semicrystalline polymer comprises poly(tetrafluoroethylene).

20. A method according to claim 14, wherein the filler comprises wherein the filler comprises greater than about 25 wt % of the gasket.

21. A method according to claim 14, wherein the container and gasket completely encapsulate the electronic device.

22. A method according to claim 14, wherein curing comprises heating the precursor of a flexible polymer to a temperature capable of initiating a curing reaction.

23. A method according to claim 14, wherein curing comprises exposing the precursor of a flexible polymer to actinic radiation.

* * * * *